(12) United States Patent
Park (10) Patent No.: US 6,476,684 B2
(45) Date of Patent: Nov. 5, 2002

(54) LOW NOISE FREQUENCY MODULATOR HAVING VARIABLE CARRIER FREQUENCY

(75) Inventor: Jae-ho Park, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 24 days.

(21) Appl. No.: 09/825,181

(22) Filed: Apr. 3, 2001

(65) Prior Publication Data

US 2002/0044025 A1 Apr. 18, 2002

(30) Foreign Application Priority Data

Aug. 28, 2000 (KR) ............................................ 00-50165

(51) Int. Cl.$^7$ ................................................ H03L 7/00
(52) U.S. Cl. ........................ 332/127; 332/128; 332/123
(58) Field of Search ............................ 331/185, 117 R, 331/179; 332/123, 127, 128

(56) References Cited

U.S. PATENT DOCUMENTS 3,611,195 A * 10/1971 Parham et al. .............. 329/326
4,510,465 A * 4/1985 Rice et al. ............. 331/117 FE
4,904,964 A * 2/1990 Peng et al. .................... 331/16

* cited by examiner

*Primary Examiner*—Robert Pascal
*Assistant Examiner*—Joseph Chang
(74) *Attorney, Agent, or Firm*—F. Chau Associates, LLP (57) ABSTRACT

A frequency modulator having variable carrier frequency is provided. A VCO frequency-modulates an oscillator input signal using an oscillation frequency set by a set signal as the carrier frequency. A phase/frequency detector outputs phase and frequency differences between a VCO output signal and a reference signal. A filter receives a phase/frequency detector output and generates the set signal. An amplifier generates a pair of output signals whose voltage levels change in opposite directions. A compensation circuit changes the voltage levels of the output signal pair and provides resulting signals to the VCO as the oscillator input signal.

15 Claims, 9 Drawing Sheets

LOW NOISE FREQUENCY MODULATOR HAVING VARIABLE CARRIER FREQUENCY

BACKGROUND OF THE INVENTION

1. Technical Field

The present invention relates generally to frequency modulators and, in particular, to a frequency modulator having a variable carrier frequency. A variable carrier frequency enables the frequency modulator to be used in a variety of communication modes.

2. Description of Related Art

In general, the discrimination between the carrier frequency of a video signal and the carrier frequency of an audio signal is made with reference to the carrier frequency of the video signal as a main carrier, and the carrier frequency of the audio signal as a sub carrier. In very high frequency (VHF) and ultra high frequency (UHF) wireless communications, video signals are transmitted in an amplitude modulation (AM) transmission mode and audio signals are transmitted in a frequency modulation (FM) transmission mode. The carrier frequency of an audio signal and the carrier frequency of a video signal vary with the transmission modes.

A National Television Systems Committee (NTSC) mode and a Phase Alternation Line (PAL) mode are the most representative transmission modes. In the NTSC mode, the carrier frequency of an audio signal is 4.5 MHz higher than that of a video signal. In the PAL mode, the spacing between the carrier frequency of an audio signal and the carrier frequency of a video signal is 5.5 MHz in a B/G mode, 6.0 MHz in an I mode and 6.5 MHz in a D/K mode. Therefore, frequency modulators which can be commonly used in a variety of transmission modes have been developed.

Figure 1:
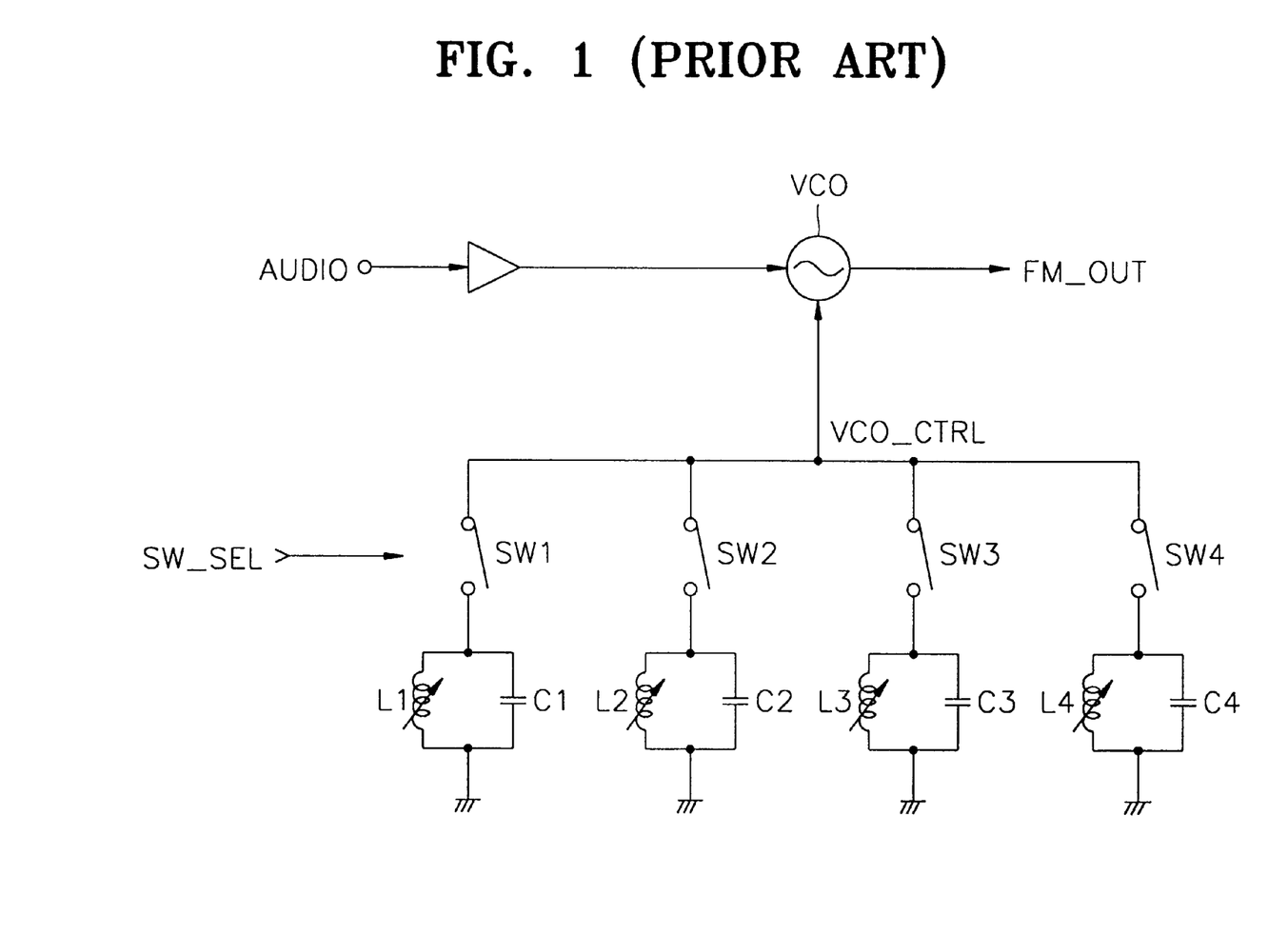
FIG. 1 is a schematic block diagram illustrating a conventional frequency modulator.

FIG. 1 is a schematic block diagram illustrating a conventional frequency modulator. In the frequency modulator, the oscillation frequency of a voltage controlled oscillator (VCO) which receives an audio signal AUDIO and generates an output signal FM_OUT is determined by a plurality of external inductor-capacitor tanks L1-C1, L2-C2, L3-C3 and L4-C4. The operations of the inductor-capacitor tanks L1-C1 through L4-C4 are controlled by switches SW1, SW2, SW3 and SW4, respectively. Each of the inductor-capacitor tanks L1-C1 through L4-C4 generates a control signal VCO_CTRL to control the oscillation frequency of the VCO. The switches SW1, SW2, SW3 and SW4 are selectively turned on in response to a switch selection signal SW_SEL. The switch selection signal SW_SEL is set externally or is set by an internal microcomputer depending on the broadcasting mode. A frequency modulator such as that shown in FIG. 1 requires many parts that are disposed external to an integrated circuit (IC), thereby increasing the manufacturing cost and complicating the manufacturing processes of the frequency modulator.

Figure 2:
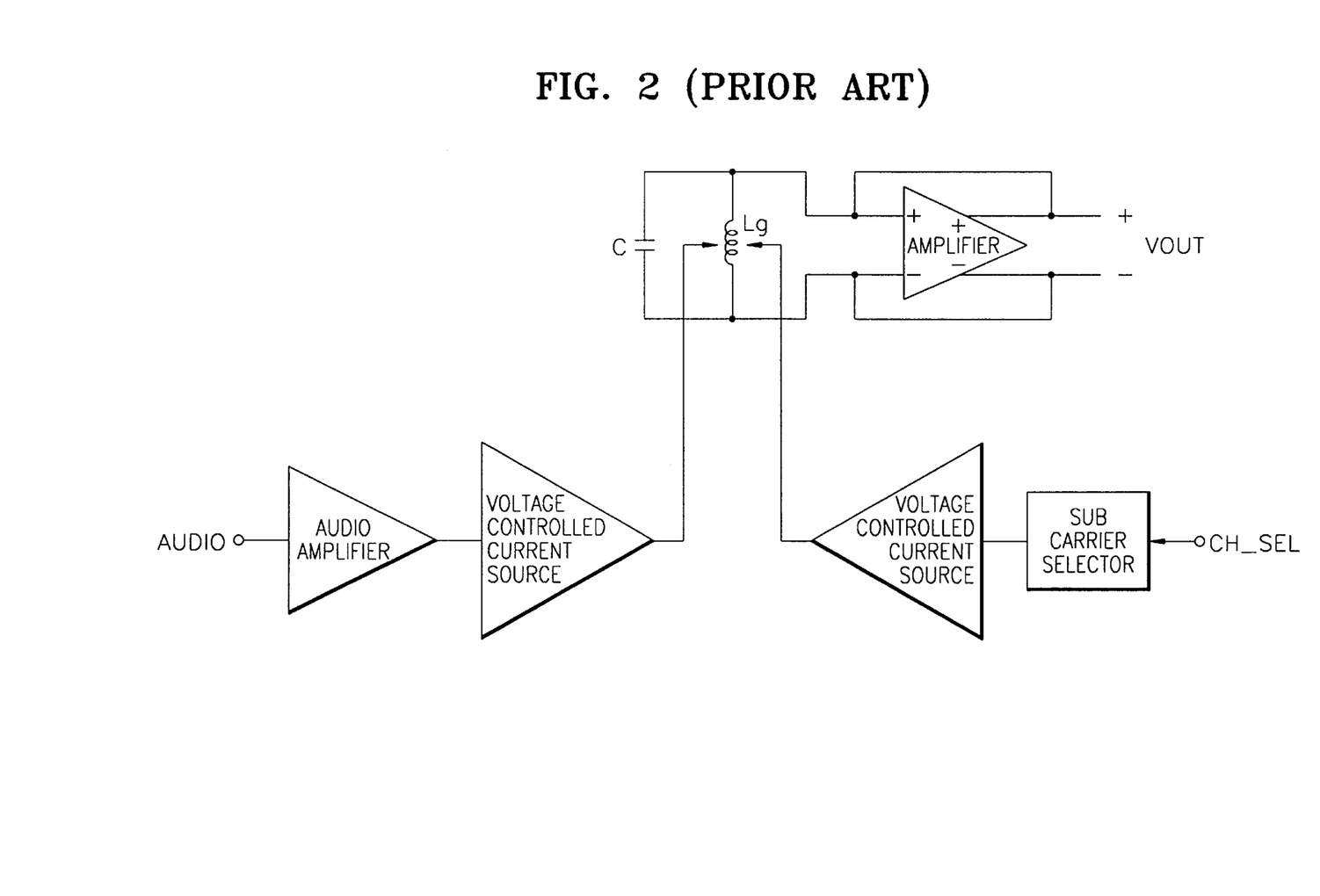
FIG. 2 is a block diagram illustrating a conventional frequency modulator that uses a gyrator.

FIG. 2 is a block diagram illustrating a conventional frequency modulator that uses a gyrator. The frequency modulator of FIG. 2 includes an audio amplifier and a sub carrier selector to alter the inductance of an inductor Lg. Unlike the frequency modulator of FIG. 1, the frequency modulator of FIG. 2 uses a gyrator as an inductor, the gyrator being an element of an inductor-capacitor tank. The gyrator is built in an IC.

The oscillation frequency of a voltage controlled oscillator is determined by the inductor Lg, which is realized as a gyrator and a capacitor C. The inductance of the gyrator is set by a channel selection signal CH_SEL that depends on the broadcasting mode. Then, an audio signal AUDIO is amplified by an audio amplifier and alters the inductance of the gyrator. When the inductance of the gyrator is altered, the resonant frequency of the inductor-capacitor tank also changes, as does an output signal VOUT. A voltage controlled current source converts voltage to current because an input signal to the gyrator is current. An amplifier connected to the output node of the frequency modulator compensates for current loss in the gyrator.

The frequency modulator of FIG. 2 reduces the number of devices external to an IC. However, the frequency modulator of FIG. 2 generates a significant amount of noise because the noise characteristic of the gyrator is very poor. Accordingly, there is a need for a frequency modulator which reduces noise and is capable of being adapted to a variety of broadcasting modes.

SUMMARY OF THE INVENTION

To solve the above and other related problems of the prior art, a low noise frequency modulator is provided which is capable of being adapted to a variety of broadcasting modes. Further, a modulation index compensation circuit is provided for adjusting the variation of the output frequency of a frequency modulator according to a carrier frequency. Moreover, a voltage controlled oscillator is provided for use in a frequency modulator which is capable of being adapted to a variety of broadcasting modes.

According to an object of the invention, there is provided a frequency modulator having a variable carrier frequency. The frequency modulator includes a voltage controlled oscillator for frequency-modulating an oscillator input signal using an oscillation frequency of the voltage controlled oscillator as the carrier frequency. The oscillation frequency being set by a set signal. A phase/frequency detector detects phase and frequency differences between an output signal of the voltage controlled oscillator and a predetermined reference signal. A low pass filter receives an output of the phase/frequency detector and generating the set signal. An audio signal amplifier amplifies an audio signal and generates a pair of output signals that have voltage levels that change in opposing directions. A modulation index compensation circuit, connected to an output node of the audio signal amplifier, changes the voltage levels of the pair of output signals and outputs the pair of output signals having the changed voltage levels to the voltage controlled oscillator as the oscillator input signal to adjust a frequency variation of the output signal of the voltage controlled oscillator according to the oscillation frequency that is set by the set signal.

According to another aspect of the invention, in a frequency modulator that includes an audio signal amplifier for amplifying an audio signal and generating a pair of output signals that have voltage levels that change in opposing directions and a voltage controlled oscillator for frequency-modulating the pair of output signals using an oscillation frequency set by a predetermined set signal as a carrier frequency, there is provided a modulation index compensation circuit. The modulation index compensation circuit includes at least one voltage level adjustment circuit between an output node of the audio signal amplifier and a predetermined reference voltage. The operation of the at least one voltage level adjustment circuit is controlled according to a selection signal. The at least one voltage level adjustment circuit is connected in parallel with other voltage level adjustment circuits when there is two or more voltage level adjustment circuits. The modulation index compensation circuit changes the voltage levels of the pair of output signals to adjust a frequency variation of an output signal of the voltage controlled oscillator according to the oscillation frequency that is set by the predetermined set signal.

According to yet another aspect of the invention, there is provided a voltage controlled oscillator for frequency-modulating an input signal using an oscillation frequency of the voltage controlled oscillator as the carrier frequency. The oscillation frequency is set by a predetermined set signal. The voltage controlled oscillator includes an oscillator core for generating an output signal which changes depending on the predetermined set signal. A capacitor converts the output signal of the oscillator core into a current and outputs the current. An input stage controls an oscillator current drained from the oscillator core using an input signal pair and the current output from the capacitor.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

Hereinafter, the present invention will be described in detail with reference to a preferred embodiment thereof. It is to be appreciated that like reference numerals in the drawings denote the same or similar elements.

Figure 3:
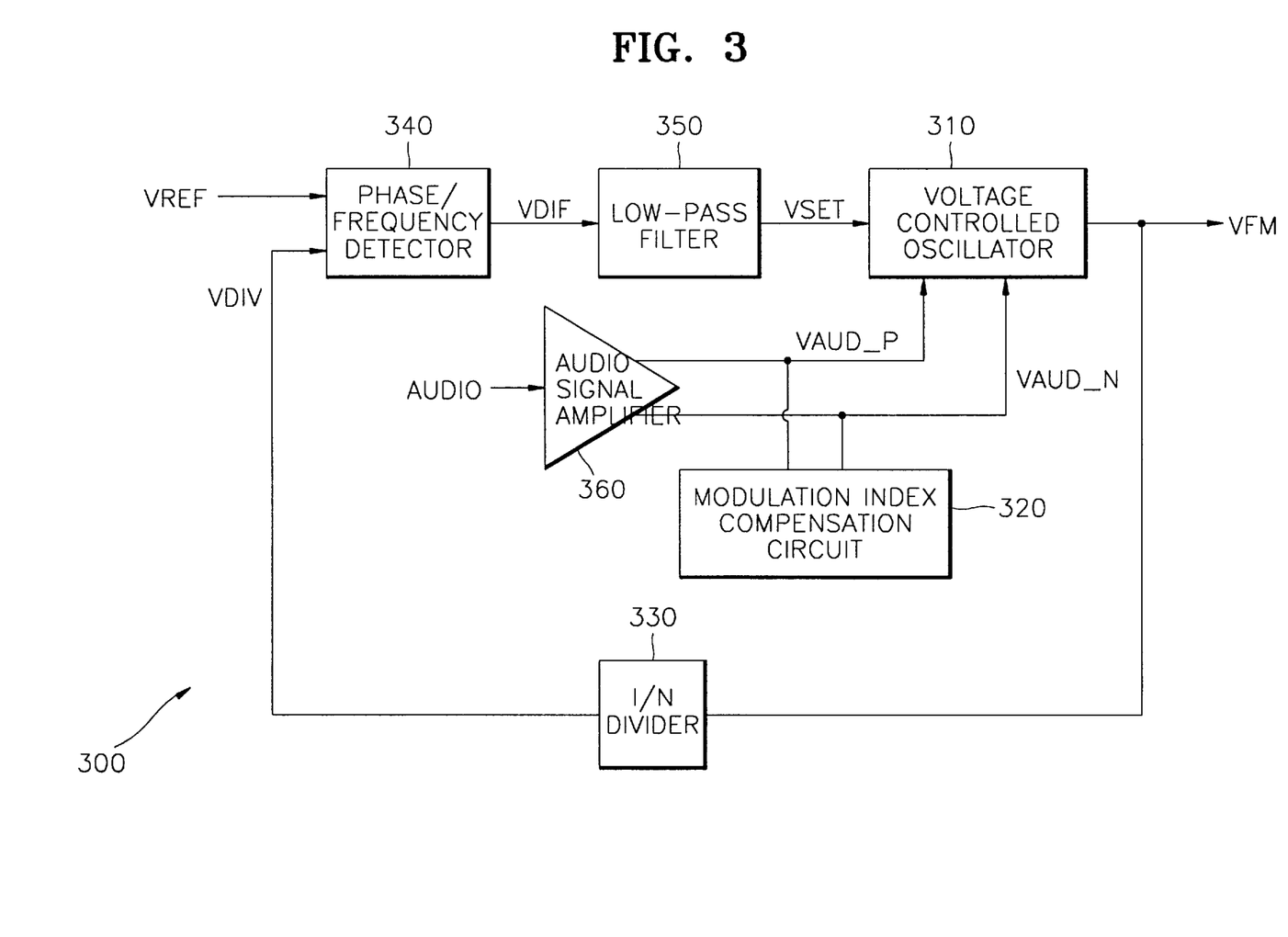
FIG. 3 is a block diagram illustrating a frequency modulator having a variable carrier frequency, according to an illustrative embodiment of the present invention.

FIG. 3 is a block diagram illustrating a frequency modulator 300 having a variable carrier frequency, according to an illustrative embodiment of the present invention. The frequency modulator 300 includes a voltage controlled oscillator 310, a modulation index compensation circuit 320, a 1/N divider 330, a phase/frequency detector 340, a low-pass filter 350 and an audio signal amplifier 360. The oscillation frequency of the voltage controlled oscillator 310 is determined by a set signal VSET output from the low-pass filter 350. The voltage controlled oscillator 310 modulates the frequency of an audio signal AUDIO using the oscillation frequency as the carrier frequency.

In an operation through which the oscillation frequency is set, a predetermined reference signal VREF is used for determining the oscillation frequency of the voltage controlled oscillator 310. The reference signal VREF is obtained by dividing a high frequency signal generated at an external oscillator (not shown) by a predetermined number. The phase/frequency detector 340 detects the phase and frequency differences between a signal VDIV output from the divider 330 (as a result of dividing an output signal VFM of the voltage controlled oscillator 310 by N) and the reference signal VREF. An output VDIF of the phase/frequency detector 340 is provided to the low-pass filter 350 for filtering and is then applied to the voltage controlled oscillator 310 as the set signal VSET.

When the frequency of the signal VDIV is smaller than that of the reference signal VREF, the set signal VSET is generated so that the frequency of the output signal VFM of the voltage controlled oscillator 310 can be increased. On the other hand, when the frequency of the signal VDIV is larger than that of the reference signal VREF, the set signal VSET is generated so that the frequency of the output signal VFM of the voltage controlled oscillator 310 can be decreased. The set signal VSET results from filtering the output signal VDIF of the phase/frequency detector 340 using the low-pass filter 350.

For example, when setting the oscillation frequency of the voltage controlled oscillator 310 to 4.5 MHz, the value of N of the divider 330 is set to 144 so that the frequency of the output signal VDIV of the divider 330 can be 31.25 KHz. In addition, a signal of 4 MHz received from an external oscillator (not shown) is divided by 128 to obtain a signal of 31.25 KHz. This signal of 31.25 KHz is applied to the phase/frequency detector 340 as the reference signal VREF.

To improve the fidelity of the phase/frequency detector 340, high frequency signals are frequency-divided by predetermined numbers and the phases and the frequencies of the resulting (low frequency) signals are compared with each other, as described above, because it is easier to compare the phases and frequencies of low frequency signals than to compare those of high frequency signals. As a result of comparing the reference signal VREF with the output signal VDIV of the divider 330 in the phase/frequency detector 340, when the frequency of the reference signal VREF is higher than that of the output signal VDIV of the divider 330, the oscillation frequency VFM output from the voltage controlled oscillator 310 is lower than 4.5 MHz. Accordingly, the low-pass filter 350 generates the set signal VSET so that the oscillation frequency of the voltage controlled oscillator 310 can be increased.

On the contrary, when the frequency of the reference signal VREF is lower than that of the output signal VDIV of the divider 330, the oscillation frequency VFM output from the voltage controlled oscillator 310 is higher than 4.5 MHz. Accordingly, the low-pass filter 350 generates the set signal VSET so that the oscillation frequency of the voltage controlled oscillator 310 can be decreased.

Consequently, the voltage controlled oscillator 310, the 1/N divider 330, the phase/frequency detector 340 and the low-pass filter 350 form a phase-locked loop (PLL), and the oscillation frequency of the voltage controlled oscillator 310 is constantly maintained in this PLL. If the frequency modulator 300 is set to oscillate at another oscillation frequency, the value of N of the 1/N divider 330 will be set to another value corresponding to the changed oscillation frequency.

The following description concerns a procedure of frequency-modulating the audio signal AUDIO using the oscillation frequency described above as the carrier frequency. The audio signal AUDIO is amplified by the audio signal amplifier 360. The audio signal amplifier 360 amplifies the audio signal AUDIO and generates a pair of output signals VAUD_P and VAUD_N, which have respective voltage levels changing in opposite directions. The voltage levels of the pair of the output signals VAUD_P and VAUD_N are adjusted by the modulation index compensation circuit 320 and then applied to the voltage controlled oscillator 310. The adjusted signals VAUD_P and VAUD_N alter the oscillation frequency of the voltage controlled oscillator 310, thereby generating a frequency modulated output VFM.

Here, the output signals VAUD_P and VAUD_N of the audio signal amplifier 360 are not directly applied to the voltage controlled oscillator 310 but are voltage level adjusted using the modulation index compensation circuit 320 before being applied to the voltage controlled oscillator 310 because the variation of the frequency of an output signal is different depending on a broadcasting mode. For example, while the frequency of an output signal has a variation of ±25 KHz with respect to an audio carrier frequency in a National Television Systems Committee (NTSC) mode, the frequency of an output signal has a variation of ±50 KHz with respect to an audio carrier frequency in a Phase Alteration Line (PAL) mode. Accordingly, the voltage levels of the pair of the amplified audio signals VAUD_P and VAUD_N should be compensated so that an output signal can have a proper frequency variation with respect to a current broadcasting mode. Another reason that the voltage levels of the output signals VAUD_P and VAUD_N of the audio signal amplifier 360 are adjusted using the modulation index compensation circuit 320 will be described hereinafter with reference to FIG. 5.

The configuration of the voltage controlled oscillator 310 and how the oscillation frequency is changed by the set signal VSET will be described hereinafter. However, for the sake of brevity and so as to not obscure the present invention, further descriptions of the phase/frequency detector 340, the low-pass filter 350 and the 1/N divider 330 have been omitted. In a preferred embodiment of the present invention, a charge pump (now shown) may be provided between the phase/frequency detector 340 and the low-pass filter 350.

Figure 4:
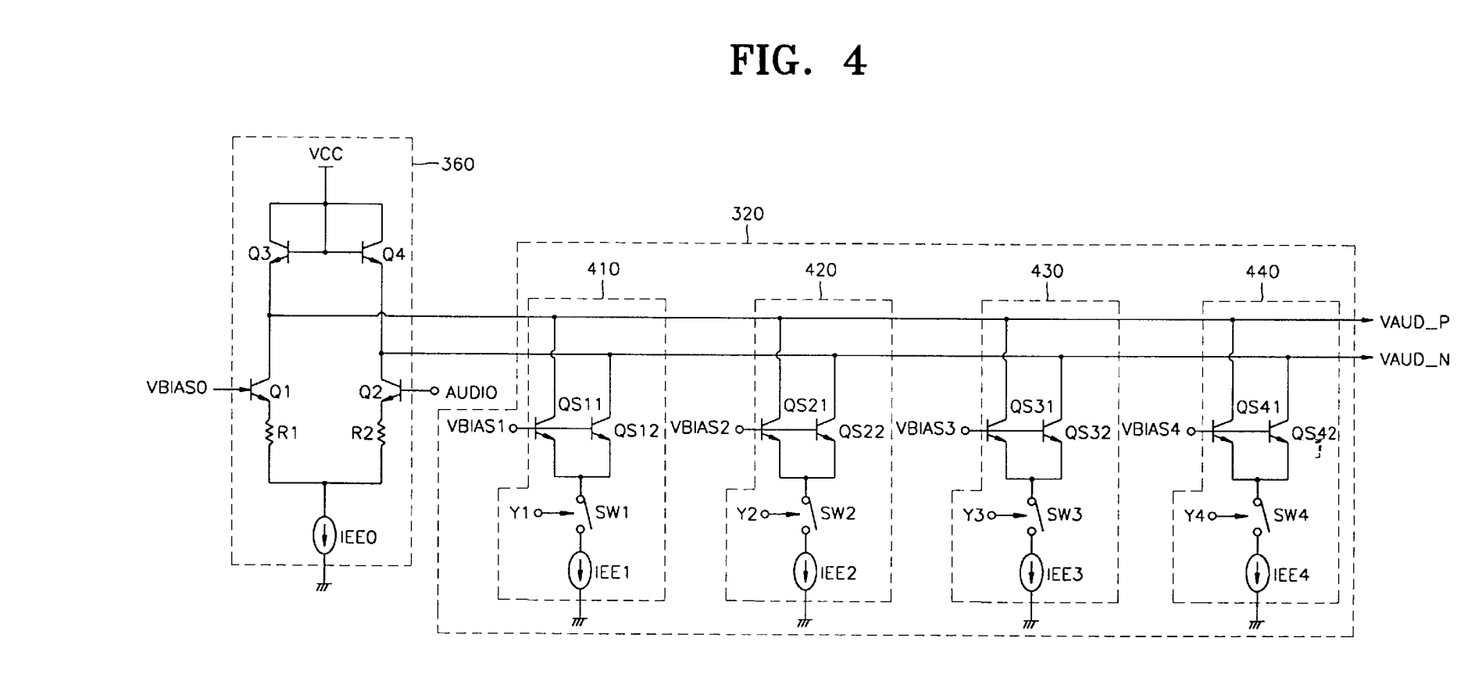
FIG. 4 is a circuit diagram of an audio signal amplifier and a modulation index compensation circuit included in the frequency modulator of FIG. 3, according to an illustrative embodiment of the present invention.

FIG. 4 is a circuit diagram of the audio signal amplifier 360 and the modulation index compensation circuit 320 included in the frequency modulator 300 of FIG. 3, according to an illustrative embodiment of the present invention. The audio signal amplifier 360 includes first through fourth transistors Q1, Q2, Q3 and Q4, first and second resistances R1 and R2 and a current sink IEE0. A predetermined bias voltage VBIAS0 and an audio signal AUDIO are applied to the bases of the first and second transistors Q1 and Q2, respectively, and control the conductance of the first and second transistors Q1 and Q2, respectively. Then, the currents flowing in the first and second resistances R1 and R2, respectively, are sunk by the current sink IEE0.

Since the current sink IEE0 sinks constant current, when the current flowing in the first resistance R1 increases (that is, the conductance of the first transistor Q1 increases), the current flowing in the second resistance R2 decreases. On the other hand, when the current flowing in the first resistance R1 decreases (that is, the conductance of the first transistor Q1 decreases), the current flowing in the second resistance R2 increases. In other words, the currents flowing in the first and second resistances R1 and R2 change in a complementarily manner.

The currents flowing in the first and second resistances R1 and R2, respectively, are converted into voltages by the third and fourth transistors Q3 and Q4, respectively, and generated as a pair of audio signals VAUD_P and VAUD_N. Here, the gain $$\frac{V_{AUD\_P} - V_{AUD\_N}}{AUDIO}$$

between the pair of the output audio signals VAUD_P and VAUD_N with respect to the input audio signal AUDIO is expressed by $$\frac{re3 + re4}{R1 + R2 + re1 + re2} \quad (1)$$

where the values of re1 through re4 are the respective reciprocals of values obtained by dividing each of the collector voltages of the respective first through fourth transistors Q1 through Q4 by a thermal voltage Vt. As seen from the above formula, the audio signal amplifier 360 reduces rather than amplifies the audio signal AUDIO. Consequently, it can be seen that the function of the audio signal amplifier 360 is not amplifying the audio signal AUDIO but setting the audio signal AUDIO to an appropriate voltage level.

The difference between the audio signals VAUD_P and VAUD_N may be expressed by the following relationship:

$$V_{AUD} = V_{AUD\_P} - V_{AUD\_N} = Vt \times \ln\left(\frac{I_{Q3}}{I_{Q4}}\right) \quad (2)$$

where $I_{Q3}$ denote the current flowing the collector and the emitter of the third transistor Q3, and $I_{Q4}$ denote the current flowing the collector and the emitter of the fourth transistor Q4.

The modulation index compensation circuit 320 of FIG. 4 includes first through fourth voltage level adjustment circuits 410, 420, 430 and 440. The first through fourth voltage level adjustment circuits 410, 420, 430 and 440 include pairs of level adjustment transistors QS11:QS12, QS21:QS22, QS31:QS32 and QS41:QS42, respectively, and switches SW1, SW2, SW3 and SW4, respectively. Each level adjustment transistor has a collector and an emitter connected between the output nodes of the audio signal amplifier 360 and the corresponding adjusting current source IEE1, IEE2, IEE3 or IEE4 and has a conductance which varies with the corresponding bias voltage VBIAS1, VBIAS2, VBIAS3 or VBIAS4. Each of the switches SW1, SW2, SW3 and SW4 blocks the current flowing between the corresponding pair of level adjustment transistors QS11:QS12, QS21:QS22, QS31:QS32 or QS41:QS42 and the corresponding adjusting current source IEE1, IEE2, IEE3 or IEE4 in response to respective selection signals Y1, Y2, Y3 and Y4.

The adjusting current sources IEE1, IEE2, IEE3 and IEE4 are grounded, thereby operating like a current sink. The voltage level adjustment circuits 410, 420, 430 and 440 adjust the voltage levels of the pair of the audio signals VAUD_P and VAUD_N in response to the first through fourth selection signals Y1, Y2, Y3 and Y4, respectively.

For example, the operation of the first voltage level adjustment circuit 410 will be described. The first selection signal Y1 turns on the switch SW1 of the first voltage level adjustment circuit 410. The conductance of the first level adjustment transistor pair QS11:QS12 is determined by the bias voltage VBIAS1 applied to the bases. Then, the first level adjustment transistor pair QS11:QS12 drain a predetermined amount of current from the output nodes of the audio signal amplifier 360, thereby lowering the voltage level of the pair of the audio signals VAUD_P and VAUD_N. The bias voltage VBIAS1 can be set in the manufacturing stage according to a broadcasting mode.

It is preferable that the selection signals Y1, Y2, Y3 and Y4 operate such that the switch of only one of the voltage level adjustment circuits 410, 420, 430 and 440 is turned on, and the switches of the remaining voltage level adjustment circuits are turned off. However, it is to be appreciated that it is not necessary to operate only one voltage level adjustment circuit for each broadcasting mode. Rather, a desired result can be obtained by combining two or more voltage level adjustment circuits.

Although the embodiment of FIG. 4 shows the modulation index compensation circuit 320 which is capable of being adapted to four different broadcasting modes, a modulation index compensation circuit which is capable of being adapted to more broadcasting modes can be implemented by adding more voltage level adjustment circuits. Although the voltage level adjustment circuits 410, 420, 430 and 440 of FIG. 4 decrease the voltage levels of the pair of the audio signals VAUD_P and VAUD_N, they can be readily configured to increase the voltage levels of the audio signals VAUD_P and VAUD_N as is apparent to one of ordinary skill in the related art. In such a case, adjusting current sources are connected to a supply voltage VCC and operate like a current source. In addition, level adjustment transistor pairs are connected to current sources and increase the voltage levels of the audio signals VAUD_P and VAUD_N.

Figure 5:
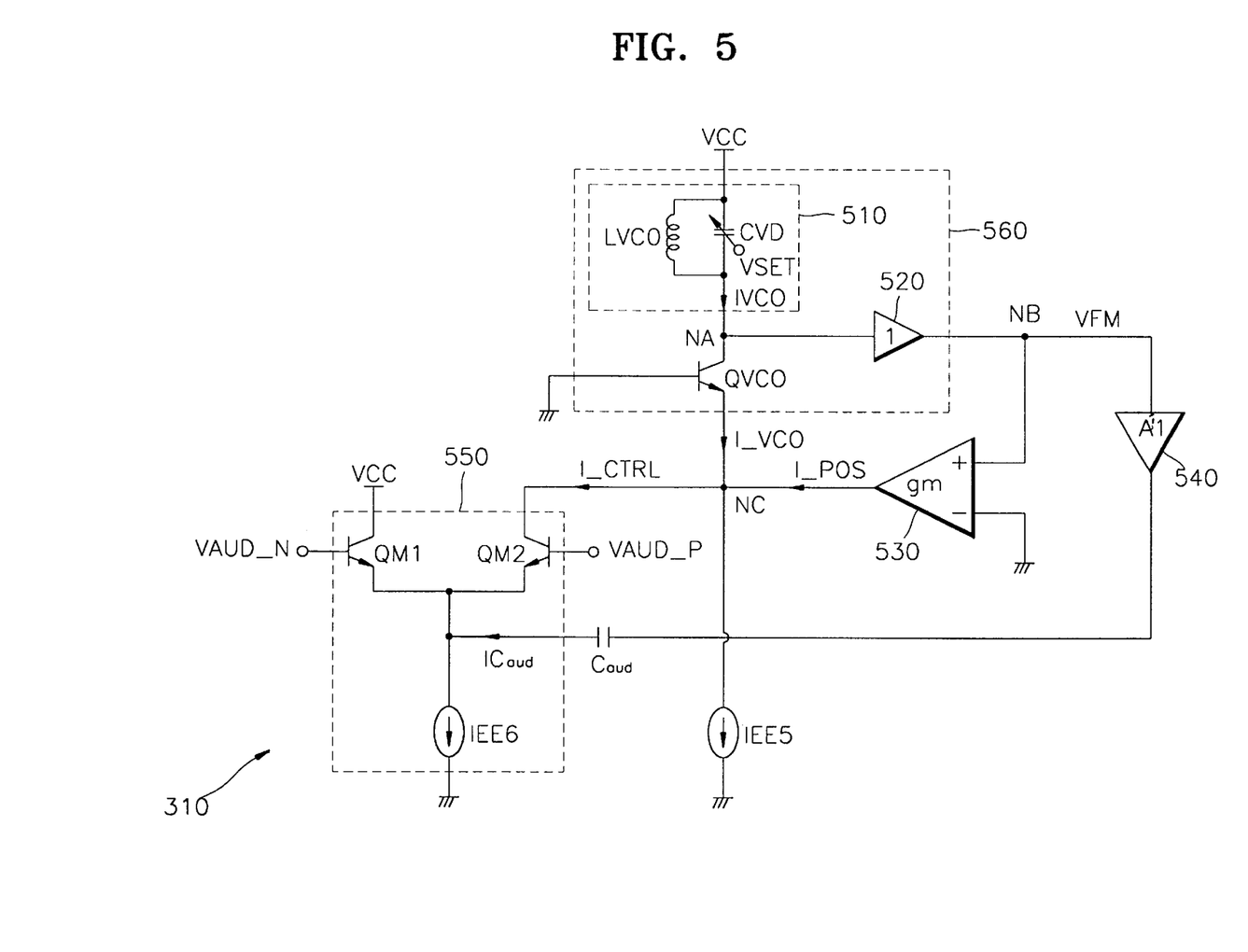
FIG. 5 is a circuit diagram illustrating a voltage controlled oscillator included in the frequency modulator of FIG. 3, according to an illustrative embodiment of the present invention.

FIG. 5 is a circuit diagram illustrating the voltage controlled oscillator 310 included in the frequency modulator 300 of FIG. 3, according to an illustrative embodiment of the present invention. The voltage controlled oscillator 310 includes a oscillator core 560, a capacitor Caud and an input stage 550.

The voltage controlled oscillator 310 of FIG. 5 is a Colpitts type and is implemented with a small number of devices to minimize noise.

The oscillator core 560 generates an output signal VFM varying with the set signal VSET generated by the low-pass filter 350 of FIG. 3. The capacitor Caud converts the output signal VFM of the oscillator core 560 into a current ICaud. The input stage 550 controls a oscillator current I_VCO drained from the oscillator core 560 depending on the pair of the output signals VAUD_P and VAUD_N of the audio signal amplifier 360 of FIG. 4 (whose voltage levels are converted by the modulation index compensation circuit 320) and on the current ICaud changed by the capacitor Caud.

The oscillator core 560 includes a oscillator transistor QVCO having a base to which a predetermined constant voltage is applied, and a positive feedback loop (NA→NB→NC) formed between the collector and the emitter of the oscillator transistor QVCO. The oscillator core 560 also includes an inductor LVCO and a variable capacitor CVD which are connected to each other in parallel between a supply voltage VCC and the collector of the oscillator transistor QVCO.

The oscillator current I_VCO is drained from the emitter of the oscillator transistor QVCO, and the value of the variable capacitor CVD is adjusted by the set signal VSET. In other words, the value of the variable capacitor CVD varies with the set signal VSET, so that the oscillation frequency of the oscillator core 560 is set. The set oscillation frequency is changed depending on the control current of the input stage 550, and the audio signal pair VAUD_N and VAUD_P are frequency-modulated.

The result that the value of the variable capacitor CVD varies with the set signal VSET is another reason that the modulation index compensation circuit 320 is required. In other words, when the value of the variable capacitor CVD varies, the voltages at both nodes of the capacitor CVD also change. Accordingly, to constantly maintain the FM modulation index of the output signal of the oscillator core 560 even if the value of the capacitor CVD varies, the voltage levels of the output signal pair VAUD_N and VAUD_P of the audio signal amplifier 360 are compensated.

The oscillator transistor QVCO and a buffer 520 on the positive feedback loop (NA→NB→NC) initiate and maintain oscillation. An OP amplifier 530 converts an input voltage signal into a current. The oscillator core 560 oscillates due to the operations of the oscillator transistor QVCO, the buffer 520 on the positive feedback loop (NA→NB→NC) and the OP amplifier 530. Here, an inductor-capacitor tank 510 operates like a band pass filter, thereby converting a current signal IVCO of the oscillator transistor QVCO into a voltage.

Although the inductor-capacitor tank 510 performs band pass filtering on the current flowing in the collector of the oscillator transistor QVCO, if it is assumed that the current gain of the oscillator transistor QVCO is sufficiently large (for example, 100 or larger), the current I_VCO flowing in the emitter is the same as the current IVCO flowing in the collector. The oscillation frequency is determined such that the sum of phase shifts in the positive feedback loop (NA→NB→NC) and in the inductor-capacitor tank 510 is exactly "0".

The OP amplifier 530 converts a voltage into a current to allow a control current I_CTRL output from the input state 550 to change the output signal VFM of the oscillator core 560. In other words, the control current I_CTRL of the input stage 550 meets a current I_POS of the positive feedback loop and the oscillator current I_VCO at the emitter node of the oscillator transistor QVCO. Here, the control current I_CTRL of the input stage 550 reduces the oscillator current I_VCO, thereby changing the oscillation frequency of the oscillator core 560. In other words, the oscillation frequency of the oscillator core 560 is set by the set signal VSET, changed by the control current I_CTRL of the input stage 560 and generated as the frequency-modulated signal VFM.

An amplifier A1 and the capacitor Caud form another feedback loop and convert the output signal VFM of the oscillator core 560 into the current ICaud to allow the output signal VFM to be mixed with the audio signal pair VAUD_N and VAUD_P output from the audio signal amplifier 360. A conversion factor used when the output signal VFM is applied to the emitters of input transistors QM1 and QM2 by the capacitor Caud is A1×sCaud (s=±jω).

The control current I_CTRL is adjusted depending on the audio output signal pair VAUD_N and VAUD_P. The input stage 550 of FIG. 5 receives the output signal pair VAUD_N and VAUD_P of the audio signal amplifier 360, whose voltage levels have been changed by the modulation index compensation circuit 320, and generates the control current I_CTRL for reducing the oscillator current I_VCO. The input stage 550 includes an input stage current sink IEE6 for sinking a predetermined current and the first and second input stage transistors QM1 and QM2. The conductance of the transistors QM1 and QM2 is controlled by the signal pair VAUD_N and VAUD_P. The collector and the emitter of the first input stage transistor QM1 are connected between the supply voltage VCC and the input stage current sink IEE6. The collector of the second input stage transistor QM2 is connected to the input stage current sink IEE6, and the control current I_CTRL flows in the emitter thereof.

If a conversion factor used when the first and second input stage transistors QM1 and QM2 convert the output signal pair VAUD_N and VAUD_P, respectively, into current is represented by $A_{AUD}$, this can be expressed by $$V_{AUD} = \tanh\left(\frac{V_{AUD}}{Vt}\right) = \tanh\left(\frac{V_{AUD\_P} - V_{AUD\_N}}{Vt}\right) \quad (3)$$

where VAUD is VAUD_P−VAUD_N.

When comparing Formula 3 with Formula 2, it can be seen that the exp(x) element of the tanh function shown in Formula 3 is the reciprocal of the ln(x) element shown in Formula 2. In other words, the relationship of Formula 4 is established.

$$\exp\left(\frac{V_{AUD}}{Vt}\right) = \exp\left(\ln\left(\frac{Ib}{Ia}\right)\right) = \frac{Ib}{Ia} \quad (4)$$

Accordingly, when the outputs of the audio signal amplifier 360 are applied to input stage 550, a conversion factor $A_{AUD}$ can be obtained which linearly changes depending on a change in an audio signal. Therefore, the control current I_CTRL linearly changes in response to the change of the audio signal.

Figure 6:
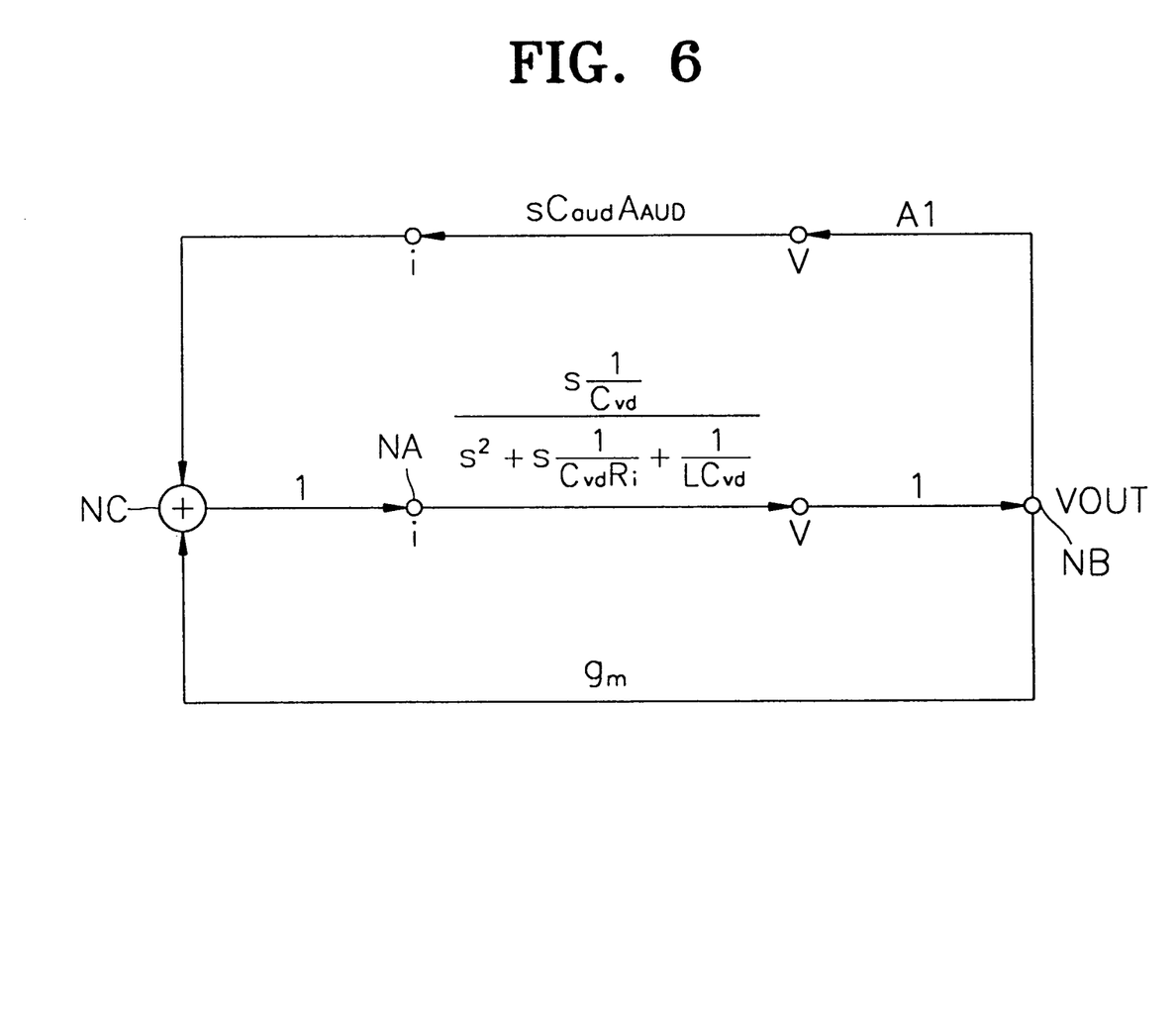
FIG. 6 is a signal flow chart illustrating the operation of the voltage controlled oscillator of FIG. 5, according to an illustrative embodiment of the present invention.

FIG. 6 is a signal flowchart illustrating the operation of the voltage controlled oscillator of FIG. 5. The output signals of the amplifier A1 and the capacitor Caud and the output signal pair VAUD_N and VAUD_P of the audio signal amplifier 360 are converted into current and input to the emitter of the oscillator transistor QVCO. The variation of the current in the emitter depends on an audio signal VAUD. As the oscillator current I_VCO flowing in the oscillator transistor QVCO changes, a time constant of the inductor-capacitor tank 510 changes depending on charging and discharging. Accordingly, the output signal VFM of the oscillator core 560 changes.

The emitter LVCO, the variable capacitor CVD and an input impedance Ri of the buffer 520 are connected to the collector of the oscillator transistor QVCO. Accordingly, an equivalent resistance can be expressed as follows:

$$H(s) = \frac{s\frac{1}{C_{VD}}}{s^2 + s\frac{1}{C_{VD} \times Ri} + \frac{1}{L_{VCO}C_{VD}}}$$

The output signal VFM of the oscillator core 560 appears as admittance in the form of current at the emitter of the oscillator transistor QVCO via the capacitor Caud and the input stage 550. The admittance is expressed by $A1 \times sC_{aud}A_{AUD}$. Therefore, a signal flowchart as shown in FIG. 6 is obtained.

As shown in FIG. 6, the signal flow includes a feedback loop having gain G (s)=(A1×sC$_{aud}$A$_{AUD}$+gm). Therefore, the condition of oscillation, 1−H(s)G(s)=0, can be obtained through Formula 5.

$$1 - \frac{\frac{s}{C_{VD}}(A1 \times sC_{aud}A_{AUD} + gm)}{s^2 + s\frac{1}{C_{VD} \times Ri} + \frac{1}{L_{VCO}C_{VD}}} = 0 \quad (5)$$

When Formula (5) is solved, a formula within a square root in the root of "s" is obtained as follows:

$$\pm \frac{1}{2}\sqrt{\left(\frac{gm - \frac{1}{Ri}}{C_{VD} - A_{AUD}A1C_{aud}}\right)^2 - \frac{4}{L_{VCO}(C_{VD} - A_{AUD}A1C_{aud})}} \quad (6)$$

In order to start oscillation, the condition $$gm > \frac{1}{Ri}$$

should be satisfied in Formula 6. In addition, the condition that the oscillation of a voltage level reaches a limit is $$gm = \frac{1}{Ri}.$$

Accordingly, an oscillation frequency $W_0$ is the frequency at which the first term (a square term) in Formula 6 is 0. When the oscillation frequency $W_0$ is applied to Formula 6, Formula 7 is obtained.

$$W_0 = \frac{1}{\sqrt{L_{VCO}(C_{VD} - A_{AUD}A1C_{aud})}} \quad (7)$$

As seen from Formula 7, the oscillation frequency $W_0$ of the frequency modulator 300 according to the present invention is influenced by the variable capacitor CVD and the conversion factor of the input stage 550. Accordingly, the oscillation frequency $W_0$ is set by the variable capacitor CVD according to a broadcasting mode and changes depending on the audio signal AUDIO.

Table 1 shows the result of a simulation of the embodiment illustrated in FIG. 3. A set voltage VSET input into the variable capacitor VCD of the oscillator core 560 was varied to obtained an oscillation frequency suitable for a given broadcasting mode. After obtaining the oscillation frequency, the variation of the oscillation frequency output when the voltage variation of an input audio signal AUDIO was set to 0.5 volts was measured.

Here, the selection signals Y1, Y2, Y3 and Y4 were applied to the modulation index compensation circuit 320 such that only one of the voltage level adjustment circuits 410, 420, 430 and 440 is operated for each broadcasting mode. For example, a selection signal (Y1, Y2, Y3, Y4)=(1, 0, 0, 0) is applied to operate only the first voltage level adjustment circuit 410.

TABLE 1

| Broadcasting modes/ Specifications of frequency variation | VAUD inputs | Oscillation frequency | Variation of oscillation frequency | Oscillation voltage level |
|---|---|---|---|---|
| NTSC | −0.5 V | 4.47435 MHz | | 1.680 Vpp |
| 4.5 MHZ | 0 V | 4.49963 MHz | 25.19 KHz | 1.679 Vpp |
| ±25 KHz | 0.5 V | 4.52473 MHz | | 1.677 Vpp |
| PAL | −0.5 V | 5.45350 MHz | | 1.748 Vpp |
| 5.5 MHZ | 0 V | 5.50405 MHz | 50.56 KHz | 1.744 Vpp |
| ±50 KHz | 0.5 V | 5.55461 MHz | | 1.740 Vpp |
| PAL | −0.5 V | 6.45229 MHz | | 1.768 Vpp |
| 6.5 MHZ | 0 V | 6.50239 MHz | 50.56 KHz | 1.765 Vpp |
| ±50 KHz | 0.5 V | 6.55251 MHz | | 1.760 Vpp |

As seen from Table 1, a frequency modulator according to the present invention satisfies the specifications of frequency variations corresponding to different specifications of carrier frequency.

Figure 7A:
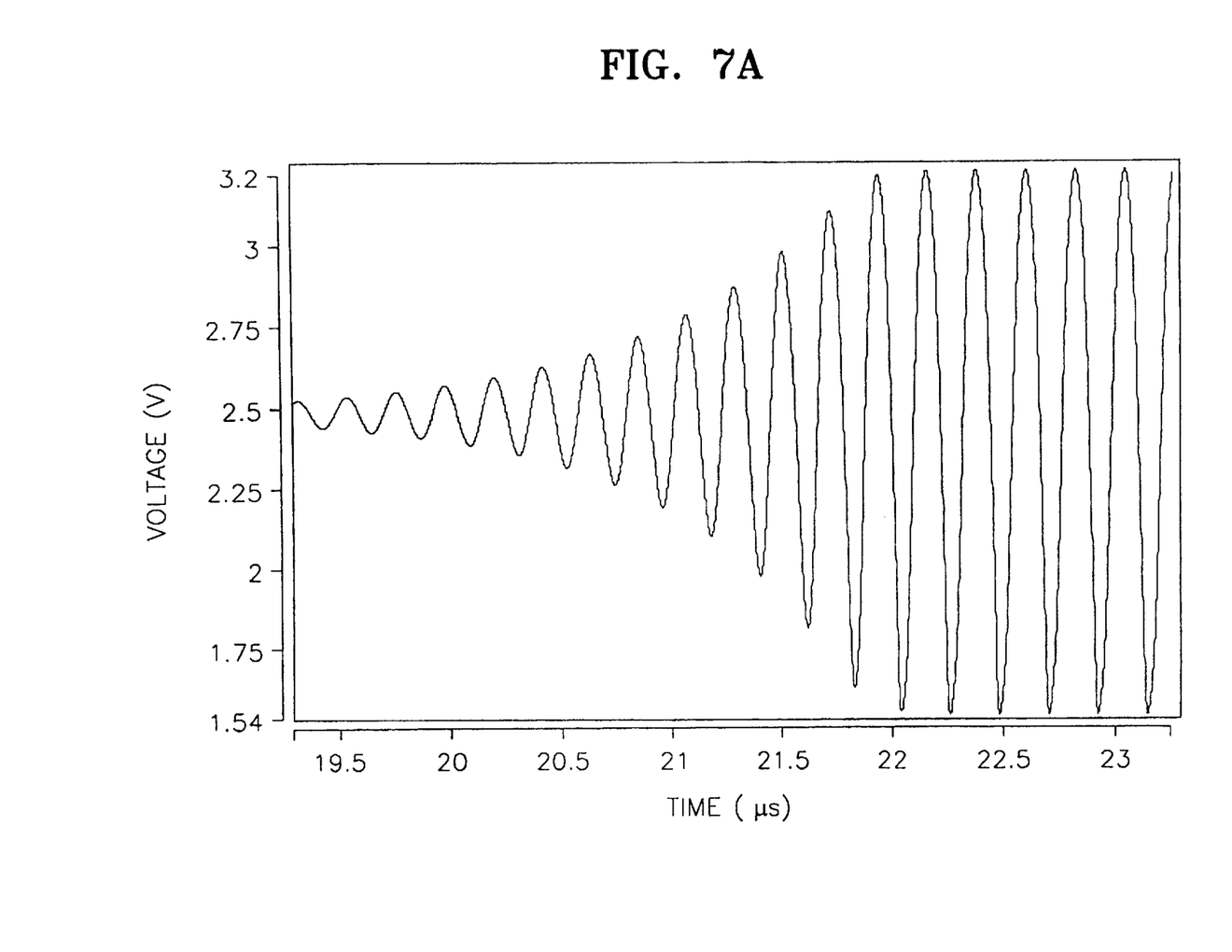
FIGS. 7A through 7C are waveform charts of output signals of a frequency modulator, according to an illustrative embodiment of the present invention.
Figure 7B:
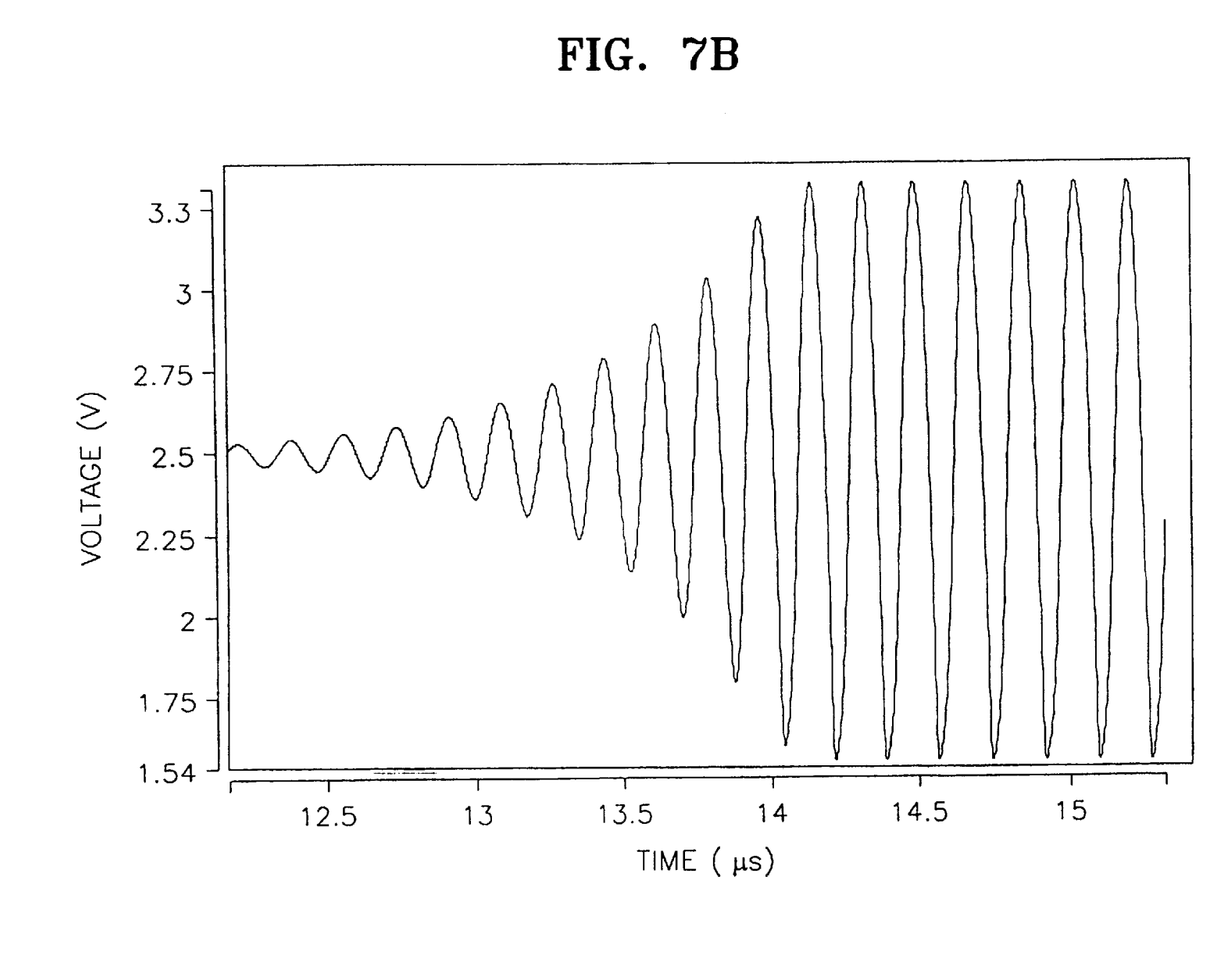
Figure 7C:
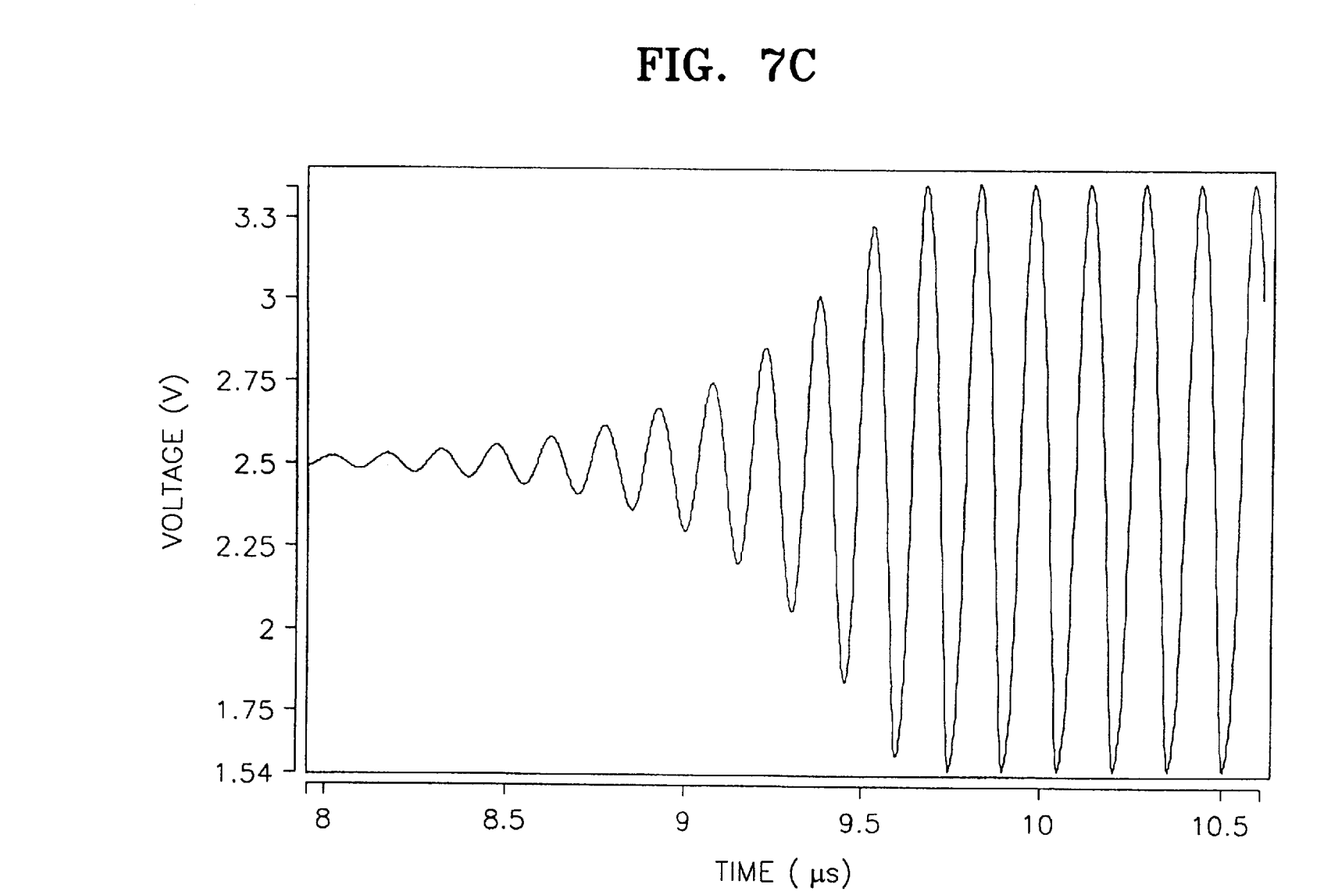

FIGS. 7A through 7C are waveform charts of output signals of a frequency modulator according to the illustrative embodiment of the present invention. FIG. 7A is a waveform chart illustrating an oscillation frequency in a NTSC mode as per Table 1; that is, in the case where the spacing between a sub carrier frequency and a carrier frequency is 4.5 MHz, and an output frequency variation of ±25 KHz is required. As shown in FIG. 7A, the oscillation frequency is stabilized at about 20 μs.

FIG. 7B is a waveform chart illustrating an oscillation frequency in a broadcasting mode where the spacing between a sub carrier frequency and a carrier frequency is 5.5 MHz, and an output frequency variation of ±50 KHz is required as per Table 1. As shown in FIG. 7B, the oscillation frequency is stabilized at about 14 μs.

FIG. 7C is a waveform chart illustrating an oscillation frequency in a broadcasting mode where the spacing between a sub carrier frequency and a carrier frequency is 6.5 MHz, and an output frequency variation of ±50 KHz is required as per Table 1.

As described above, in a frequency modulator according to the present invention, the number of individual devices are minimized, so that the manufacturing cost can be reduced. In addition, since an oscillator of a Colpitts type (having a low noise characteristic) is implemented with a small number of devices, the noise generated from the devices is reduced.

According to the present invention, a frequency modulator can reduce noise and be adapted to a variety of broadcasting modes. In addition, a modulation index compensation circuit can adjust the frequency variation of a frequency modulated output to be suitable for a variety of carrier frequencies. Moreover, a voltage controlled oscillator is provided for use in a low noise frequency modulator which is capable of being adapted to a variety of broadcasting modes.

Although the invention has been described with reference to a particular embodiment, it will be apparent to one of ordinary skill in the art that modifications to the described embodiment may be made. For example, a modulation index compensation circuit is not restricted to the embodiment shown in the attached drawings, but can be modified into a variety of forms without departing from the spirit of the invention. Therefore, the scope of the invention will be defined by the attached claims.

What is claimed is:

1. A frequency modulator having a variable carrier frequency, comprising:

a voltage controlled oscillator for frequency-modulating an oscillator input signal using an oscillation frequency of the voltage controlled oscillator as the carrier frequency, the oscillation frequency being set by a set signal;

a phase/frequency detector for detecting phase and frequency differences between an output signal of the voltage controlled oscillator and a predetermined reference signal;

a low pass filter for receiving an output of the phase/frequency detector and generating the set signal;

an audio signal amplifier for amplifying an audio signal and generating a pair of output signals that have voltage levels that change in opposing directions; and a modulation index compensation circuit, connected to an output node of the audio signal amplifier, for changing the voltage levels of the pair of output signals and outputting the pair of output signals having the changed voltage levels to the voltage controlled oscillator as the oscillator input signal to adjust a frequency variation of the output signal of the voltage controlled oscillator according to the oscillation frequency that is set by the set signal.

2. The frequency modulator of claim 1, further comprising a 1/N divider for dividing the output signal of the voltage controlled oscillator by N and applying a divided result to the phase/frequency detector, wherein N is natural number.

3. The frequency modulator of claim 1, wherein the modulation index compensation circuit comprises at least one voltage level adjustment circuit connected between the output node of the audio signal amplifier and a first reference voltage, an operation of the at least one voltage level adjustment circuit being controlled according to a selection signal, the at least one voltage level adjustment circuit being connected in parallel with other voltage level adjustment circuits when there is two or more voltage level adjustment circuits.

4. The frequency modulator of claim 3, wherein the voltage level adjustment circuit comprises:

a pair of level adjustment transistors, each of the level adjustment transistors having a collector and an emitter connected between an adjustment current source and one of the pair of output signals generated by the audio signal amplifier, a conductance of each of the level adjustment transistors changing based on a predetermined bias voltage; and a switch for blocking current flow between the pair of level adjustment transistors and the adjustment current source in response to the selection signal.

5. The frequency modulator of claim 4, wherein the modulation index compensation circuit comprises a plurality of voltage level adjustment circuits, each of the plurality of voltage level adjustment circuits including one of a plurality of switches, the selection signal turning on only one switch among the plurality of switches and turning off any remaining switches among the plurality of switches.

6. The frequency modulator of claim 1, wherein the voltage controlled oscillator comprises:

an oscillator core for generating an output signal varying with the set signal;

a capacitor for converting the output signal of the oscillator core into a current and outputting the current; and an input stage for controlling an oscillator current drained from the oscillator core using the pair of output signals output from the modulation index compensation circuit and the current output from the capacitor.

7. The frequency modulator of claim 6, wherein the oscillator core comprises:
- an oscillator transistor having a base, a collector, and an emitter, the base having a predetermined constant voltage applied thereto;
- a positive feedback loop formed between the collector and the emitter of the oscillator transistor; and
- an inductor and a variable capacitor connected in parallel between a second reference voltage and one of the collector and the emitter of the oscillator transistor, the oscillator current being drained from another one of the collector and the emitter of the oscillator transistor, a value of the variable capacitor being adjusted by the set signal.

8. The frequency modulator of claim 6, wherein the input stage receives the pair of output signals output from the modulation index compensation circuit, and generates a control current for reducing the oscillator current, the control current linearly changing in response to changes in the audio signal.

9. The frequency modulator of claim 8, wherein the input stage comprises:
- an in put stage current sink for sinking a predetermined current; and
- first and second input stage transistors, each having a collector and an emitter, and a conductance that is adjusted by the pair of output signals output from the modulation index compensation circuit, one of the collector and the emitter of the first input stage transistor being connected to a predetermined second reference voltage and another one of the collector and the emitter of the first input stage transistor being connected to the input stage current sink, one of the collector and the emitter of the second input stage transistor being connected to the input stage current sink, and the control current flowing in another one of the collector and the emitter of the second input stage transistor.

10. In a frequency modulator that includes an audio signal amplifier for amplifying an audio signal and generating a pair of output signals that have voltage levels that change in opposing directions and a voltage controlled oscillator for frequency-modulating the pair of output signals using an oscillation frequency set by a predetermined set signal as a carrier frequency, a modulation index compensation circuit comprises:
- at least one voltage level adjustment circuit between an output node of the audio signal amplifier and a predetermined reference voltage, an operation of the at least one voltage level adjustment circuit being controlled according to a selection signal, the at least one voltage level adjustment circuit being connected in parallel with other voltage level adjustment circuits when there is two or more voltage level adjustment circuits,
- wherein the modulation index compensation circuit changes the voltage levels of the pair of output signals to adjust a frequency variation of an output signal of the voltage controlled oscillator according to the oscillation frequency that is set by the predetermined set signal.

11. The modulation index compensation circuit of claim 10, wherein the at least one voltage level adjustment circuit comprises:
- an adjustment current source;
- a pair of level adjustment transistors, each of the level adjustment transistors having a collector and an emitter which are connected between an adjustment current source and one of the pair of output signals generated by the audio signal amplifier, a conductance of each of the level adjustment transistors changing based on a predetermined bias voltage; and
- a switch for blocking current flow between the pair of level adjustment transistors and the adjustment current source in response to the selection signal.

12. The modulation index compensation circuit of claim 10, wherein the modulation index compensation circuit further comprises a plurality of voltage level adjustment circuits, each of the plurality of voltage level adjustment circuits including one of a plurality of switches, the selection signal turning on only one switch among the plurality of switches and turning off any remaining switches among the plurality of switches.

13. A voltage controlled oscillator for frequency-modulating an input signal using an oscillation frequency of the voltage controlled oscillator as the carrier frequency, the oscillation frequency being set by a predetermined set signal, the voltage controlled oscillator comprising:
- an oscillator core for generating an output signal which changes depending on the predetermined set signal;
- a capacitor for converting the output signal of the oscillator core into a current and outputting the current; and
- an input stage for controlling an oscillator current drained from the oscillator core using an input signal pair and the current output from the capacitor.

14. The voltage controlled oscillator of claim 13, wherein the oscillator core comprises:
- an oscillator transistor having a base, a collector, and an emitter, the base having a predetermined constant voltage applied thereto;
- a positive feedback loop formed between the collector and the emitter of the oscillator transistor; and
- an inductor and a variable capacitor connected in parallel between a predetermined reference voltage and one of the collector and the emitter of the oscillator transistor, the oscillator current being drained from an other one of the collector and the emitter of the oscillator transistor, a value of the variable capacitor being adjusted by the predetermined set signal.

15. The voltage controlled oscillator of claim 13, wherein the input stage comprises:
- an input stage current sink for sinking a predetermined current; and
- first and second input stage transistors each having a collector and an emitter, and a conductance that is adjusted by the input signal pair, one of the collector and the emitter of the first input stage transistor being connected to a predetermined reference voltage and an other one of the collector and the emitter of the first input stage transistor being connected to the input stage current sink, one of the collector and the emitter of the second input stage transistor being connected to the input stage current sink and the control current flowing in an other one of the collector and the emitter of the second input stage transistor.

* * * * *